US012563696B2

(12) United States Patent
Chehade et al.

(10) Patent No.: US 12,563,696 B2
(45) Date of Patent: Feb. 24, 2026

(54) DUAL RESERVOIR IMMERSIVE COOLING SYSTEM

(71) Applicant: OVH, Roubaix (FR)

(72) Inventors: Ali Chehade, Moncheaux (FR); Gregory Francis Louis Bauchart, Wattrelos (FR)

(73) Assignee: OVH, Roubaix (FR)

( * ) Notice: Subject to any disclaimer, the term of this patent is extended or adjusted under 35 U.S.C. 154(b) by 197 days.

(21) Appl. No.: 18/373,539

(22) Filed: Sep. 27, 2023

(65) Prior Publication Data

US 2024/0023287 A1    Jan. 18, 2024

Related U.S. Application Data

(63) Continuation of application No. PCT/IB2022/052975, filed on Mar. 30, 2022.

(30) Foreign Application Priority Data

Apr. 1, 2021    (EP) .................................... 21305427

(51) Int. Cl.
  *H05K 7/20*        (2006.01)
  *G06F 1/20*        (2006.01)
  *H01L 23/44*       (2006.01)

(52) U.S. Cl.
  CPC ......... *H05K 7/20236* (2013.01); *H01L 23/44* (2013.01); *G06F 1/20* (2013.01);
  (Continued)

(58) Field of Classification Search
  CPC ........... H05K 7/20236; H05K 7/20772; H05K 7/20781; H05K 7/20272; G06F 1/20; H01L 23/44; H01L 23/473
  See application file for complete search history.

(56) References Cited

U.S. PATENT DOCUMENTS

| | | | |
|---|---|---|---|
| 2,115,501 A | 4/1938 | Sergius | |
| 2,316,296 A | 4/1943 | Simonds | |
| | (Continued) | | |

FOREIGN PATENT DOCUMENTS

| | | | |
|---|---|---|---|
| CN | 201898432 U | 7/2011 | |
| CN | 103687443 A | 3/2014 | |
| | (Continued) | | |

OTHER PUBLICATIONS

Office Action with regard to the counterpart U.S. Appl. No. 17/698,037 mailed Feb. 26, 2024.

(Continued)

*Primary Examiner* — Zachary Pape
(74) *Attorney, Agent, or Firm* — BCF LLP

(57)    ABSTRACT

An immersive cooling system is described. The system includes an immersive cooling container, including: a first reservoir; a second reservoir; numerous slots, each configured to hold a casing; a reservoir connector corresponding to each slot, and configured to provide fluid communication with the first reservoir; and a pump configured to convey a dielectric immersion cooling liquid from the second reservoir to the first reservoir. The immersive cooling system also includes a casing, configured to contain an electronic device and to fit within a slot of the container. The casing includes an inlet configured to be in fluid communication with the reservoir connector of the slot within which the casing is disposed to facilitate flow of the cooling liquid into an interior of the casing through the reservoir connector and an outlet configured to facilitate flow of the cooling liquid from the interior of the casing into the second reservoir.

8 Claims, 8 Drawing Sheets

(52) U.S. Cl.
CPC ..... *H05K 7/20272* (2013.01); *H05K 7/20772*
(2013.01); *H05K 7/20781* (2013.01)

(56) References Cited

U.S. PATENT DOCUMENTS

| | | | |
|---|---|---|---|
| 3,938,689 A | 2/1976 | De Munnik | |
| 4,279,966 A | 7/1981 | Wakana et al. | |
| 4,619,316 A | 10/1986 | Nakayama et al. | |
| 4,888,664 A | 12/1989 | Rojc | |
| 5,268,814 A | 12/1993 | Yakubowski | |
| 5,307,956 A | 5/1994 | Richter et al. | |
| 5,669,524 A | 9/1997 | Loedel | |
| 5,907,473 A | 5/1999 | Przilas et al. | |
| 6,023,934 A | 2/2000 | Gold | |
| 6,746,388 B2 | 6/2004 | Edwards et al. | |
| 6,847,525 B1 | 1/2005 | Smith et al. | |
| 6,883,593 B2 | 4/2005 | Johnson et al. | |
| 6,899,164 B1 | 5/2005 | Li et al. | |
| 6,931,834 B2 | 8/2005 | Jones | |
| 7,369,410 B2 | 5/2008 | Chen et al. | |
| 7,403,392 B2 | 7/2008 | Attlesey et al. | |
| 7,414,845 B2 | 8/2008 | Attlesey et al. | |
| 7,472,795 B2 | 1/2009 | Dubon et al. | |
| 7,527,085 B2 | 5/2009 | Iijima et al. | |
| 7,724,517 B2 | 5/2010 | Attlesey et al. | |
| 7,885,070 B2 | 2/2011 | Campbell et al. | |
| 7,900,796 B2 | 3/2011 | Ungrady et al. | |
| 7,905,106 B2 | 3/2011 | Attlesey | |
| 7,911,782 B2 | 3/2011 | Attlesey et al. | |
| 7,911,793 B2 | 3/2011 | Attlesey | |
| 8,009,419 B2 | 8/2011 | Attlesey et al. | |
| 8,014,150 B2 | 9/2011 | Campbell et al. | |
| 8,089,764 B2 | 1/2012 | Attlesey | |
| 8,089,765 B2 | 1/2012 | Attlesey | |
| 8,089,766 B2 | 1/2012 | Attlesey | |
| 8,291,964 B2 | 10/2012 | Hwang et al. | |
| 8,305,759 B2 | 11/2012 | Attlesey et al. | |
| 8,467,189 B2 | 6/2013 | Attlesey | |
| 8,619,425 B2 | 12/2013 | Campbell et al. | |
| 8,654,529 B2 | 2/2014 | Tufty et al. | |
| 8,934,244 B2 | 1/2015 | Shelnutt et al. | |
| 8,953,317 B2 | 2/2015 | Campbell et al. | |
| 9,049,800 B2 | 6/2015 | Shelnutt et al. | |
| 9,051,502 B2 | 6/2015 | Sedarous et al. | |
| 9,086,859 B2 | 7/2015 | Tufty et al. | |
| 9,128,681 B2 | 9/2015 | Tufty et al. | |
| 9,144,179 B2 | 9/2015 | Shelnutt et al. | |
| 9,155,230 B2 | 10/2015 | Eriksen | |
| 9,176,547 B2 | 11/2015 | Tufty et al. | |
| 9,195,282 B2 | 11/2015 | Shelnutt et al. | |
| 9,223,360 B2 | 12/2015 | Tufty et al. | |
| 9,265,173 B1 | 2/2016 | Jhang et al. | |
| 9,328,964 B2 | 5/2016 | Shelnutt et al. | |
| 9,335,802 B2 | 5/2016 | Shelnutt et al. | |
| 9,351,429 B2 | 5/2016 | Shelnutt et al. | |
| 9,382,914 B1 | 7/2016 | Sharfi | |
| 9,426,927 B2 | 8/2016 | Shafer et al. | |
| 9,436,235 B2 | 9/2016 | Damaraju et al. | |
| 9,464,854 B2 | 10/2016 | Shelnutt et al. | |
| 9,529,395 B2 | 12/2016 | Franz et al. | |
| 9,699,938 B2 | 7/2017 | Shelnutt et al. | |
| 9,699,939 B2 | 7/2017 | Smith | |
| 9,717,166 B2 | 7/2017 | Eriksen | |
| 9,756,766 B2 | 9/2017 | Best | |
| 9,773,526 B2 | 9/2017 | Shelnutt et al. | |
| 9,781,859 B1 | 10/2017 | Wishman et al. | |
| 9,795,065 B2 | 10/2017 | Shelnutt et al. | |
| 9,801,465 B1 | 10/2017 | Finch | |
| 9,839,164 B2 | 12/2017 | Shelnutt et al. | |
| 9,844,166 B2 | 12/2017 | Shelnutt et al. | |
| 9,861,194 B1 | 1/2018 | Park | |
| 9,872,561 B1 | 1/2018 | Alfaro | |
| 9,921,622 B2 | 3/2018 | Shelnutt et al. | |
| 9,968,010 B2 | 5/2018 | Shelnutt et al. | |
| 9,992,914 B2 | 6/2018 | Best et al. | |
| 10,010,013 B2 | 6/2018 | Shelnutt et al. | |
| 10,018,425 B2 | 7/2018 | Shelnutt et al. | |
| 10,020,242 B2 | 7/2018 | Katsumata et al. | |
| 10,064,314 B2 | 8/2018 | Shelnutt et al. | |
| 10,104,808 B2 | 10/2018 | Scharinger et al. | |
| 10,130,008 B2 | 11/2018 | Shepard et al. | |
| 10,143,113 B2 | 11/2018 | Shelnutt et al. | |
| 10,143,114 B2 | 11/2018 | Shelnutt et al. | |
| 10,146,231 B2 | 12/2018 | Shelnutt et al. | |
| 10,149,408 B2 | 12/2018 | Fujiwara et al. | |
| 10,156,873 B2 | 12/2018 | Shelnutt et al. | |
| 10,172,262 B2 | 1/2019 | Shelnutt et al. | |
| 10,206,312 B2 | 2/2019 | Shelnutt et al. | |
| 10,212,857 B2 | 2/2019 | Eriksen | |
| 10,225,958 B1 | 3/2019 | Gao | |
| 10,238,010 B2 | 3/2019 | Shelnutt et al. | |
| 10,271,456 B2 | 4/2019 | Tufty et al. | |
| 10,321,609 B2 | 6/2019 | Hirai et al. | |
| 10,331,144 B2 | 6/2019 | Shelnutt et al. | |
| 10,399,190 B2 | 9/2019 | North et al. | |
| 10,542,635 B2 | 1/2020 | Nishiyama | |
| 10,598,441 B2 | 3/2020 | Kawabata et al. | |
| 10,617,042 B2 | 4/2020 | Shelnutt et al. | |
| 10,622,283 B2 | 4/2020 | Leobandung | |
| 10,624,236 B2 | 4/2020 | Inano et al. | |
| 10,624,242 B2 | 4/2020 | Best | |
| 10,638,641 B2 | 4/2020 | Franz et al. | |
| 10,645,841 B1 | 5/2020 | Mao et al. | |
| 10,653,036 B1 | 5/2020 | Gao | |
| 10,667,434 B1 | 5/2020 | Mao et al. | |
| 10,674,641 B2 | 6/2020 | Shepard et al. | |
| 10,716,238 B2 | 7/2020 | Brink | |
| 10,729,039 B2 | 7/2020 | Shelnutt et al. | |
| 10,791,647 B1 | 9/2020 | Miyamura et al. | |
| 10,809,011 B2 | 10/2020 | Chu et al. | |
| 10,871,807 B2 | 12/2020 | Best et al. | |
| 10,881,019 B2 * | 12/2020 | Fujiwara | H05K 7/20236 |
| 10,888,032 B2 | 1/2021 | Wakino et al. | |
| 10,917,998 B2 | 2/2021 | Shelnutt et al. | |
| 10,932,390 B2 | 2/2021 | Korikawa | |
| 10,939,580 B2 | 3/2021 | Gao | |
| 10,939,581 B1 | 3/2021 | Chen et al. | |
| 10,990,144 B2 | 4/2021 | Wang et al. | |
| 11,006,547 B2 * | 5/2021 | Gao | G06F 1/20 |
| 11,032,939 B2 | 6/2021 | Tufty et al. | |
| 11,071,238 B2 | 7/2021 | Edmunds et al. | |
| 11,107,749 B2 | 8/2021 | Taniguchi et al. | |
| 11,184,997 B2 * | 11/2021 | Broderick | H05K 7/023 |
| 11,268,739 B2 | 3/2022 | Wang et al. | |
| 11,572,614 B2 | 2/2023 | Sakamoto et al. | |
| 11,751,359 B2 | 9/2023 | Heydari | |
| 11,822,398 B2 | 11/2023 | Heydari | |
| 11,837,830 B2 | 12/2023 | Crighton et al. | |
| 11,882,670 B2 * | 1/2024 | Gao | H05K 7/20772 |
| 2002/0159233 A1 | 10/2002 | Patel et al. | |
| 2004/0244947 A1 | 12/2004 | Chen | |
| 2005/0145582 A1 | 7/2005 | Dubon et al. | |
| 2005/0150637 A1 | 7/2005 | Tan et al. | |
| 2005/0248922 A1 | 11/2005 | Chu et al. | |
| 2007/0025081 A1 | 2/2007 | Berlin et al. | |
| 2007/0227756 A1 | 10/2007 | Doerr et al. | |
| 2009/0146294 A1 | 6/2009 | Hillman et al. | |
| 2009/0205590 A1 | 8/2009 | Vetrovec | |
| 2009/0260777 A1 | 10/2009 | Attlesey et al. | |
| 2010/0103620 A1 | 4/2010 | Campbell et al. | |
| 2010/0108292 A1 | 5/2010 | Bhunia et al. | |
| 2010/0118494 A1 | 5/2010 | Campbell et al. | |
| 2010/0170657 A1 | 7/2010 | Kaslusky | |
| 2010/0328889 A1 | 12/2010 | Campbell et al. | |
| 2011/0026776 A1 | 2/2011 | Liang et al. | |
| 2011/0028617 A1 | 2/2011 | Hill et al. | |
| 2011/0267768 A1 | 11/2011 | Attlesey | |
| 2011/0284194 A1 | 11/2011 | Sarkar et al. | |
| 2011/0286177 A1 | 11/2011 | Attlesey | |
| 2011/0317367 A1 | 12/2011 | Campbell et al. | |
| 2012/0007579 A1 | 1/2012 | Apblett et al. | |
| 2012/0014064 A1 | 1/2012 | St Rock et al. | |
| 2012/0058588 A1 | 3/2012 | Mayer et al. | |
| 2012/0075797 A1 | 3/2012 | Attlesey | |

(56) References Cited

U.S. PATENT DOCUMENTS

| | | | |
|---|---|---|---|
| 2012/0120599 A1 | 5/2012 | Chua et al. | |
| 2012/0193068 A1 | 8/2012 | Nemesh et al. | |
| 2013/0050963 A1 | 2/2013 | Zhou et al. | |
| 2013/0105120 A1 | 5/2013 | Campbell et al. | |
| 2013/0312839 A1* | 11/2013 | Shelnutt | H05K 7/20772 |
| | | | 137/15.01 |
| 2013/0341471 A1 | 12/2013 | Yang et al. | |
| 2014/0123492 A1 | 5/2014 | Campbell et al. | |
| 2014/0216688 A1 | 8/2014 | Shelnutt et al. | |
| 2014/0218845 A1 | 8/2014 | Peng et al. | |
| 2014/0218861 A1 | 8/2014 | Shelnutt et al. | |
| 2014/0321054 A1 | 10/2014 | Kaefer et al. | |
| 2015/0061568 A1 | 3/2015 | Martinez | |
| 2015/0109730 A1 | 4/2015 | Campbell et al. | |
| 2015/0237767 A1 | 8/2015 | Shedd et al. | |
| 2015/0330718 A1 | 11/2015 | St Rock et al. | |
| 2016/0021793 A1 | 1/2016 | Chen | |
| 2016/0120059 A1 | 4/2016 | Shedd et al. | |
| 2016/0305565 A1 | 10/2016 | Miller et al. | |
| 2016/0330874 A1 | 11/2016 | Sato et al. | |
| 2016/0360637 A1 | 12/2016 | Harvilchuck et al. | |
| 2016/0366792 A1 | 12/2016 | Smith | |
| 2017/0105313 A1 | 4/2017 | Shedd et al. | |
| 2017/0127565 A1 | 5/2017 | Campbell et al. | |
| 2017/0181328 A1 | 6/2017 | Shelnutt et al. | |
| 2017/0241721 A1 | 8/2017 | Liang | |
| 2017/0265328 A1 | 9/2017 | Sasaki et al. | |
| 2018/0008467 A1 | 1/2018 | Cater et al. | |
| 2018/0027695 A1 | 1/2018 | Wakino et al. | |
| 2018/0042138 A1 | 2/2018 | Campbell et al. | |
| 2018/0070477 A1 | 3/2018 | Saito | |
| 2018/0084671 A1 | 3/2018 | Matsumoto et al. | |
| 2018/0092243 A1 | 3/2018 | Saito | |
| 2018/0153058 A1 | 5/2018 | Hirai et al. | |
| 2018/0196484 A1 | 7/2018 | Saito | |
| 2018/0246550 A1 | 8/2018 | Inaba et al. | |
| 2018/0295745 A1 | 10/2018 | De Meijer et al. | |
| 2018/0338388 A1 | 11/2018 | We et al. | |
| 2019/0014685 A1 | 1/2019 | So et al. | |
| 2019/0090383 A1 | 3/2019 | Tufty et al. | |
| 2019/0098796 A1 | 3/2019 | Wakino et al. | |
| 2019/0218101 A1 | 7/2019 | Huang et al. | |
| 2019/0223324 A1 | 7/2019 | Le et al. | |
| 2019/0297747 A1 | 9/2019 | Wakino et al. | |
| 2020/0025451 A1 | 1/2020 | Stone et al. | |
| 2020/0093037 A1 | 3/2020 | Enright et al. | |
| 2020/0095667 A1 | 3/2020 | Sakamoto et al. | |
| 2020/0150731 A1 | 5/2020 | Wang et al. | |
| 2020/0196489 A1 | 6/2020 | Chang et al. | |
| 2020/0214169 A1 | 7/2020 | Tsunoda | |
| 2020/0267872 A1 | 8/2020 | Harada et al. | |
| 2020/0288600 A1 | 9/2020 | Gao | |
| 2020/0305307 A1 | 9/2020 | Amos et al. | |
| 2020/0323100 A1 | 10/2020 | Chiu et al. | |
| 2020/0323108 A1 | 10/2020 | Bilan et al. | |
| 2020/0389998 A1 | 12/2020 | Tung et al. | |
| 2020/0390007 A1 | 12/2020 | Edmunds et al. | |
| 2021/0051815 A1 | 2/2021 | Van et al. | |
| 2021/0076531 A1 | 3/2021 | Tung et al. | |
| 2021/0102294 A1 | 4/2021 | Miljkovic et al. | |
| 2021/0112683 A1 | 4/2021 | Mohajer et al. | |
| 2021/0185850 A1 | 6/2021 | Kulkarni et al. | |
| 2021/0321526 A1 | 10/2021 | Kulkarni et al. | |
| 2021/0327787 A1 | 10/2021 | Yang et al. | |
| 2021/0385971 A1 | 12/2021 | Gorius et al. | |
| 2021/0410292 A1 | 12/2021 | Yang et al. | |
| 2021/0410319 A1 | 12/2021 | Manousakis et al. | |
| 2021/0410320 A1 | 12/2021 | Yang et al. | |
| 2021/0410328 A1 | 12/2021 | Yang et al. | |
| 2022/0256744 A1 | 8/2022 | Le et al. | |
| 2023/0059446 A1 | 2/2023 | Gao | |
| 2024/0152163 A1 | 5/2024 | Heger et al. | |
| 2025/0194044 A1* | 6/2025 | Chehade | H05K 7/20781 |

FOREIGN PATENT DOCUMENTS

| | | | |
|---|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020223806 A1 | 11/2020 |
| WO | 2020234600 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

Office Action with regard to the counterpart U.S. Appl. No. 17/697,616 mailed Feb. 26, 2024.

Notice of Allowance with regard to the counterpart U.S. Appl. No. 17/690,839 mailed Mar. 5, 2024.

Extended European Search Report with regard to the counterpart EP Patent Application No. 22305018.8 completed Jun. 24, 2022.

Office Action with regard to the counterpart U.S. Appl. No. 17/701,422 mailed Mar. 28, 2023.

Notice of Allowance with regard to the counterpart U.S. Appl. No. 17/691,494 mailed Apr. 17, 2023.

Office Action with regard to the counterpart U.S. Appl. No. 17/697,452 mailed May 11, 2023.

Office Action with regard to the counterpart U.S. Appl. No. 17/698,480 mailed Sep. 7, 2023.

Office Action with regard to the counterpart U.S. Appl. No. 17/697,264 mailed Nov. 22, 2023.

Office Action with regard to the counterpart U.S. Appl. No. 17/697,452 mailed Nov. 22, 2023.

Office Action with regard to the counterpart U.S. Appl. No. 18/373,555 issued Jun. 17, 2025.

Office Action with regard to the counterpart U.S. Appl. No. 17/690,833 mailed Mar. 28, 2024.

Office Action with regard to the counterpart U.S. Appl. No. 17/697,452 mailed Mar. 25, 2024.

Office Action with regard to te counterpart CN Patent Application No. 2022103375051 issued May 11, 2024.

Office Action with regard to te counterpart U.S. Appl. No. 17/690,839 issued Jun. 25, 2024.

(56) References Cited

OTHER PUBLICATIONS

Office Action with regard to te counterpart U.S. Appl. No. 17/698,480 issued Jul. 3, 2024.
Office Action with regard to the counterpart U.S. Appl. No. 17/694,765 mailed Dec. 21, 2023.
Office Action with regard to te counterpart CN Patent Application No. 2022103326074 issued Jul. 29, 2024.
Office Action with regard to the counterpart CN Patent Application No. 2022103375314 issued Aug. 12, 2024.
Notice of Allowance with regard to the counterpart U.S. Appl. No. 17/707,200 issued Aug. 15, 2024.
"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-factor-mode, retrieved on Jul. 19, 2021, 6 pages.
"IBM's Hot-Water Supercomputer Goes Live", Data Center Knowledge, retrieved on Jul. 19, 2021, 9 pages.
Extended European Search Report with regard to the EP Patent Application No. 21306771.3 completed May 23, 2022.
Extended European Search Report with regard to the EP Patent Application No. 21306173.2 completed Feb. 18, 2022.
Extended European Search Report with regard to the EP Patent Application No. 21306174.0 completed Feb. 14, 2022.
Extended European Search Report with regard to the EP Patent Application No. 21306172.4 completed Feb. 15, 2022.
English Abstract for JP2020065002 retrieved on Espacenet on Jun. 2, 2022.
Extended European Search Report with regard to the EP Patent Application No. 21306186.4 completed Feb. 10, 2022.
Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Notice of Allowance with regard to te counterpart U.S. Appl. No. 17/697,616 issued Jul. 23, 2024.
Office Action with regard to the counterpart U.S. Appl. No. 17/697,452 issued Sep. 6, 2024.
International Search Report and Written Opinion with regard to PCTIB2022053071 mailed Jun. 28, 2022.
International Search Report and Written Opinion with regard to PCT/IB2022/052975 mailed Jun. 20, 2022.
International Search Report and Written Opinion with regard to PCTIB2022052330 mailed May 30, 2022.
International Search Report and Written Opinion with regard to PCT/IB2022/052976 mailed Jun. 17, 2022.
International Search Report and Written Opinion with regard to PCT/IB2022/052977 mailed Jun. 20, 2022.
European Search Report with regard to EP21306170.8 completed Feb. 12, 2022.
European Search Report with regard to EP21306189.8 completed Feb. 10, 2022.
Office Action with regard to the counterpart CN Patent Application No. 2022103478109 issued Aug. 30, 2024.
Office Action with regard to the counterpart U.S. Appl. No. 18/373,567 issued Jul. 18, 2025.
Notice of Allowance with regard to the counterpart U.S. Appl. No. 18/373,543 issued Oct. 21, 2025.

* cited by examiner

DUAL RESERVOIR IMMERSIVE COOLING SYSTEM

CROSS-REFERENCE

The present patent application is a continuation of PCT Application PCT/I132022/052975 filed on Mar. 30, 2022 claiming priority to European Patent Application Number 21305427.3, filed on Apr. 1, 2021, the disclosures of which are hereby incorporated by reference herein in their entireties.

FIELD OF TECHNOLOGY

The present technology relates to immersion-cooled electronic equipment. In particular, the present technology relates to an immersive cooling container that uses reservoirs to distribute immersion cooling liquid.

BACKGROUND

Electronic equipment, for example servers, memory banks, computer disks, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Fans are commonly mounted within equipment racks to provide forced ventilation cooling to rack-mounted equipment. This solution merely displaces some of the heat generated within the racks to the general environment of the data center, and also takes up significant space on the racks, e.g., reducing the number of servers per square meter of data center space.

Liquid cooling, in particular water cooling, has been used as an addition or replacement to traditional forced-air cooling. Cold plates, for example water blocks having internal channels for water circulation, may be mounted on heat-generating components, such as processors, to displace heat from the processors toward heat exchangers. Air-to-liquid heat exchangers, for example finned tube heat exchangers similar to radiators, may be mounted to the racks to absorb and transport some of this displaced heat toward external cooling equipment, for example cooling towers, located outside of the data center.

Immersion cooling (sometimes called immersive cooling) was more recently introduced. Electronic components are inserted in a container that is fully or partially filled with a non-conducting cooling liquid, for example an oil-based dielectric cooling liquid. Good thermal contact is obtained between the electronic components and the dielectric cooling liquid, typically by either partially or completely immersing the electronic components in the dielectric liquid. The dielectric cooling liquid circulates within the container at a level that is sufficient to cool the electronic components. In some systems, pumps are used to circulate the liquid. Additionally, heat sinks may be mounted on some heat-generating devices. Some other heat-generating devices may have porous surfaces so that the contact between these devices and the dielectric cooling liquid is more thermally efficient. In some immersion cooling systems, the dielectric cooling liquid may be cooled through the use of cooling subsystems, such as liquid-to-liquid heat exchangers and/or dry cooler (i.e., radiator-type) heat exchangers.

Immersion cooling systems commonly take the form of large tanks or "pods" (refered to herein as "immersive cooling containers") in which one or more electronic devices, generally within a casing or attached to a chassis are immersed in the dielectric cooling liquid, such that circulation of the liquid within the immersive cooling container facilitates cooling of the one or more electronic devices. In some immersion cooling systems, the electronic devices are disposed in casings, and the dielectric immersion cooling liquid flows within the casings to cool the electronic devices.

Immersive cooling containers typically rely on manifolds and piping arrangements to guide the immersion cooling liquid from the casings containing the electronic devices through an external heat exchanger for cooling, and to guide the cooled liquid back to the casings. However, this leads to low versatility of disposition of the casings within the immersive cooling container, due to fluid connection requirements of the casings.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art. In particular, such shortcomings may include the expense, complications, and lack of versatility associated with use of omplex manifolds and piping arrangements to guide the immersion cooling liquid from the casings containing the electronic devices through an external heat exchanger for cooling, and to guide the cooled liquid back to the casings.

In accordance with one aspect of the present disclosure, the technology is implemented as immersive cooling system configured to cool at least one electronic device. The immersive cooling system includes an immersive cooling container, including: a first reservoir, configured to contain a dielectric immersion cooling liquid; a second reservoir, configured to contain the dielectric immersion cooling liquid; a plurality of slots, each slot in the plurality of slots configured to hold a casing; a reservoir connector corresponding to each slot in the plurality of slots, the reservoir connector configured to provide fluid communication with the first reservoir; and a pump configured to convey the dielectric immersion cooling liquid from the second reservoir to the first reservoir. The immersive cooling system also includes a casing, configured to contain an electronic device to be cooled in an interior portion of the casing and configured to be disposed within a slot in the plurality of slots of the immersive cooling container. The casing includes an inlet configured to be in fluid communication with the reservoir connector corresponding to the slot within which the casing is disposed to facilitate flow of the dielectric immersion cooling liquid into the interior portion of the casing through the reservoir connector, such that the dielectric immersion cooling liquid contacts the electronic device to collect thermal energy from the electronic device. The casing also includes an outlet configured to facilitate flow of the dielectric immersion cooling liquid from the interior portion of the casing into the second reservoir.

In some implementations, the inlet includes a casing connector configured to fluidly couple with the reservoir connector corresponding to the slot within which the casing is disposed. In some implementations, a size of the casing connector is smaller than a size of the reservoir connector, such that the casing connector fits within the corresponding reservoir connector. In some implementations, a size of the casing connector is larger than a size of the reservoir connector, such that the reservoir connector fits within the corresponding casing connector. In some implementations, the casing connector is disposed on a bottom portion of the casing. In some implementations the casing connector includes a perpendicular cross portion. In some implementations, the casing connector includes an angled cross portion.

In some implementations, the immersive cooling system includes a heat exchanger connected to the pump, such that the pump conveys the dielectric immersion cooling liquid from the second reservoir through the heat exchanger prior to conveying the dielectric immersion cooling liquid to the first reservoir.

In some implementations, the second reservoir comprises a sealing chamber, the sealing chamber comprising a plurality of openings aligned with the plurality of slots, each opening enabling insertion of a casing in a corresponding one of the slots, each opening being in a closed configuration by default to prevent the dielectric immersion cooling liquid from flowing from the second reservoir to a corresponding slot in absence of a casing in said slot.

In some implementations, the reservoir connector corresponding to an empty slot is covered by a metal plate. In some implementations, the reservoir connector corresponding to an empty slot is closed using a self-closing mechanism.

In some implementations, the immersive cooling container further includes a second reservoir connector corresponding to each slot in the plurality of slots, the second reservoir connector configured to provide fluid communication with the second reservoir. In some implementations, the outlet includes a second casing connector configured to fluidly couple with the second reservoir connector corresponding to the slot within which the casing is disposed.

In some implementations, the first reservoir is disposed below the casing, such that the dielectric immersion cooling liquid from the first reservoir flows upwards into the interior portion of the casing. In some implementations, the outlet is disposed in an upper portion of the casing, and wherein the second reservoir is disposed at an upper portion of the casing, to receive a flow of the dielectric immersion cooling liquid from the outlet.

In some implementations, the first reservoir is disposed above the casing, such that the dielectric immersion cooling liquid from the first reservoir flows downward into the casing, and pours, drips, or sprays onto the electronic device.

In some implementations, the plurality of slots is a plurality of lateral slots, each of the lateral slots being defined in a lateral side of the immervise cooling container, such that the casing is inserted through the lateral side of the immervise cooling container.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid-state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

With these fundamentals in place, we will now consider some non-limiting examples to illustrate various implementations of aspects of the present disclosure.

Figure 1:
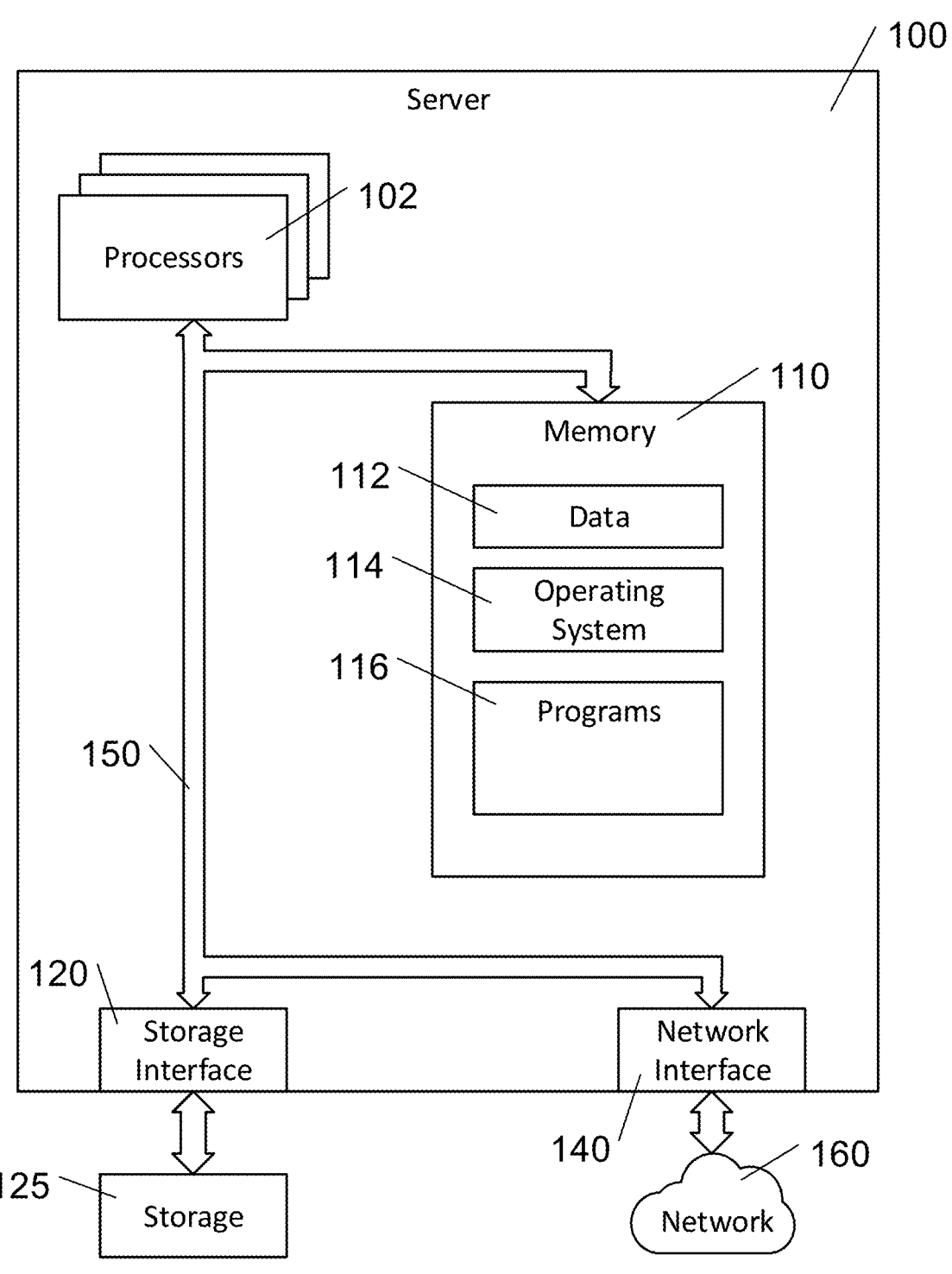
FIG. 1 shows a block diagram of a server as an example of an electronic device that may be cooled in an immersive cooling container.

FIG. 1 shows an example of an electronic device, such as a server, which may be cooled in an immersion cooling system. As shown in FIG. 1, the server 100 includes the one or more processors 102, a memory 110, a storage interface 120, and a network interface 140. These system components are interconnected via a bus 150, which may include one or more internal and/or external buses (not shown) to which the various hardware components are electronically coupled.

The memory 110, which may be a random-access memory or any other type of memory, may contain data 112, an operating system 114, and one or more programs 116. The data 112 may be any data that serves as input to or output from any program on the server 100. The operating system 114 is an operating system such as MICROSOFT WINDOWS or LINUX. The programs 116 may be any programs or sets of programs that include programmed instructions that may be executed by the processors to control actions taken by the server 100.

The storage interface 120 is used to connect storage devices, such as the storage device 125, to the server 100. One type of storage device 125 is a solid-state drive, which may use an integrated circuit assembly to store data persistently. Such solid-state drives are commonly used in servers, such as the server 100 as "local" storage, though other types of storage may also be used. The server 100 may also access storage that is physically located on a different electronic device, e.g., over a network.

In some implementations, the server 100 may use well-known virtual memory techniques that allow the programs of the server 100 to behave as if they have access to a large, contiguous address space instead of access to multiple, smaller storage spaces, such as the memory 110 and the storage device 125. Therefore, while the data 112, the operating system 114, and the programs 116 are shown to reside in the memory 110, those skilled in the art will recognize that these items are not necessarily wholly contained in the memory 110 at the same time.

The processors 102 may include one or more microprocessors and/or other integrated circuits, such as graphics processing units (GPUs), tensor processing units (TPUs), neural processing units (NPUs), application-specific integrated circuits (ASICs), or other special-purpose processing devices. The processors 102 execute program instructions stored in the memory 110 and/or in other memory devices (not shown) connected to or integrated with particular processors 102.

The network interface 140 is used to connect the server 100 to other systems or networked devices (not shown) via a network 160. The network interface 140 may include a combination of hardware and software that allows communicating on the network 160. The software in the network interface 140 may include software that uses one or more network protocols to communicate over the network 160. For example, the network protocols may include TCP/IP (Transmission Control Protocol/Internet Protocol).

It will be understood that the server 100 is merely a simplified example of such a server, and many other configurations of servers could be immersion-cooled. Further, it will be recognized that the server 100 is only one type of electronic device that could be immersion-cooled, and that many other types or configurations of electronic devices could also benefit from immersion cooling in a data center environment.

Figure 2:
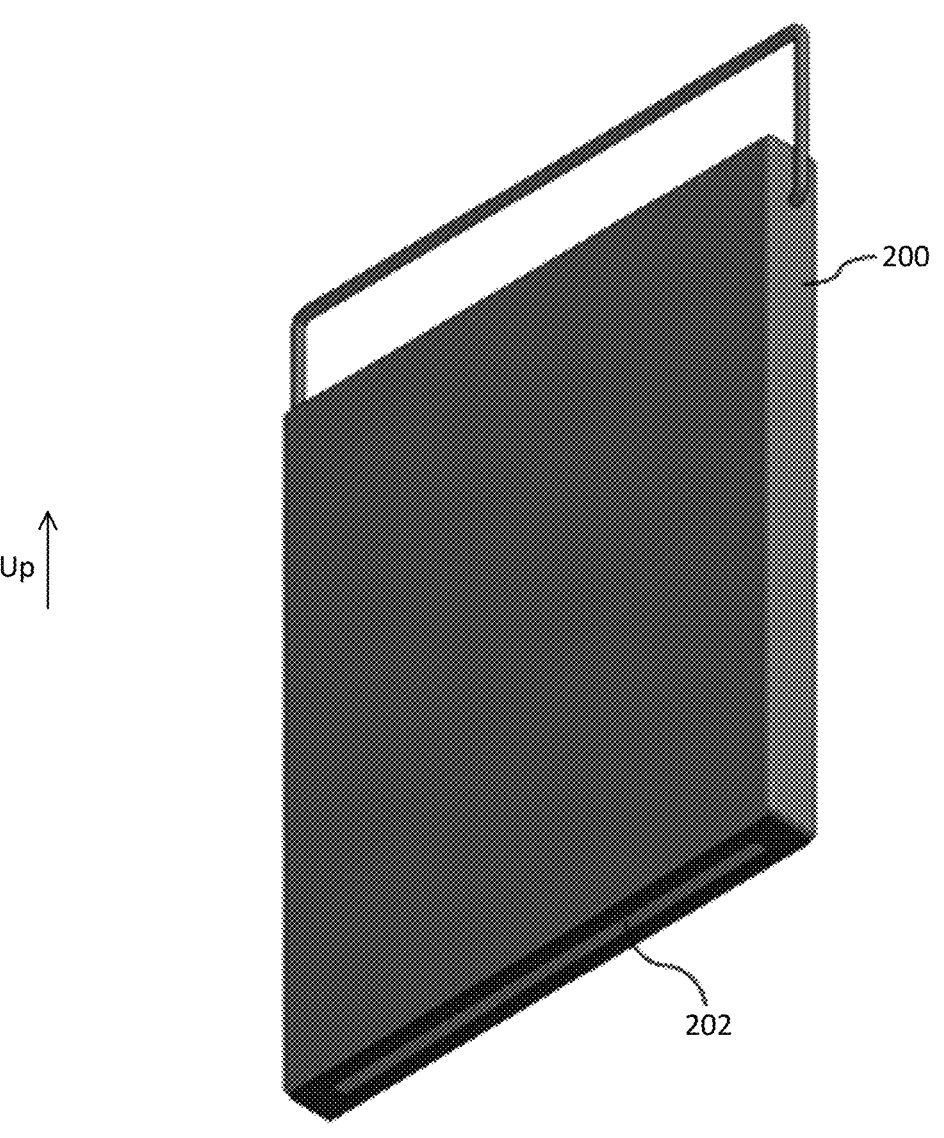
FIG. 2 shows a casing for housing an electronic device, for use in an immersive cooling container in accordance with an implementation of the disclosed technology.

FIG. 2 shows a casing 200 for use in an immersive cooling container (not shown) according to an implementation of the disclosed technology, with the direction of the immersive cooling container indicated by the arrow labeled "up". The casing 200 generally has an electronic device (not shown), such as the server 100, as described with reference to FIG. 1, mounted within the casing 200. The casing 200 is mechanically configured to facilitate placement of the casing 200 (including the enclosed electronic device) into the immersive cooling container. In accordance with the disclosed technology, the casing 200 includes a casing connector 202 that is configured to couple the casing to a corresponding reservoir connector (not shown) in the immersive cooling container to provide an inlet to the casing, such that the interior of the casing 200 is in fluid communication with a reservoir (not shown) in the immersive cooling container. In some implementations, the casing 200 also includes an outlet (not shown), configured to permit the flow of heated dielectric immersion cooling liquid from the casing. In some implementations, such as the implementation shown in FIG. 2, the casing connector 202 is disposed on a bottom portion of the casing 200.

Although shown in FIG. 2 as generally rectangular in shape, in some implementations, the casing connector 202 may have different shapes or forms, such as a "T" shape, or another shape or form having perpendicular or angled cross portions, or other shapes to accommodate fluid connections and/or stability. In some implementations, the casing connector 202 may include two or more separate connector portions, which may connect to a single reservoir or to two or more separate reservoirs. The two or more separate connector portions may also connect to a single interior portion of the casing 200 or to two or more separate interior portions of the casing 200. In some implementations, the casing connector 202 may be disposed on a different portion of the casing 200. In some implementations, the outlet may be a separate casing connector, and/or there may be two or more casing connectors disposed on portions of the casing 200.

Figure 3:
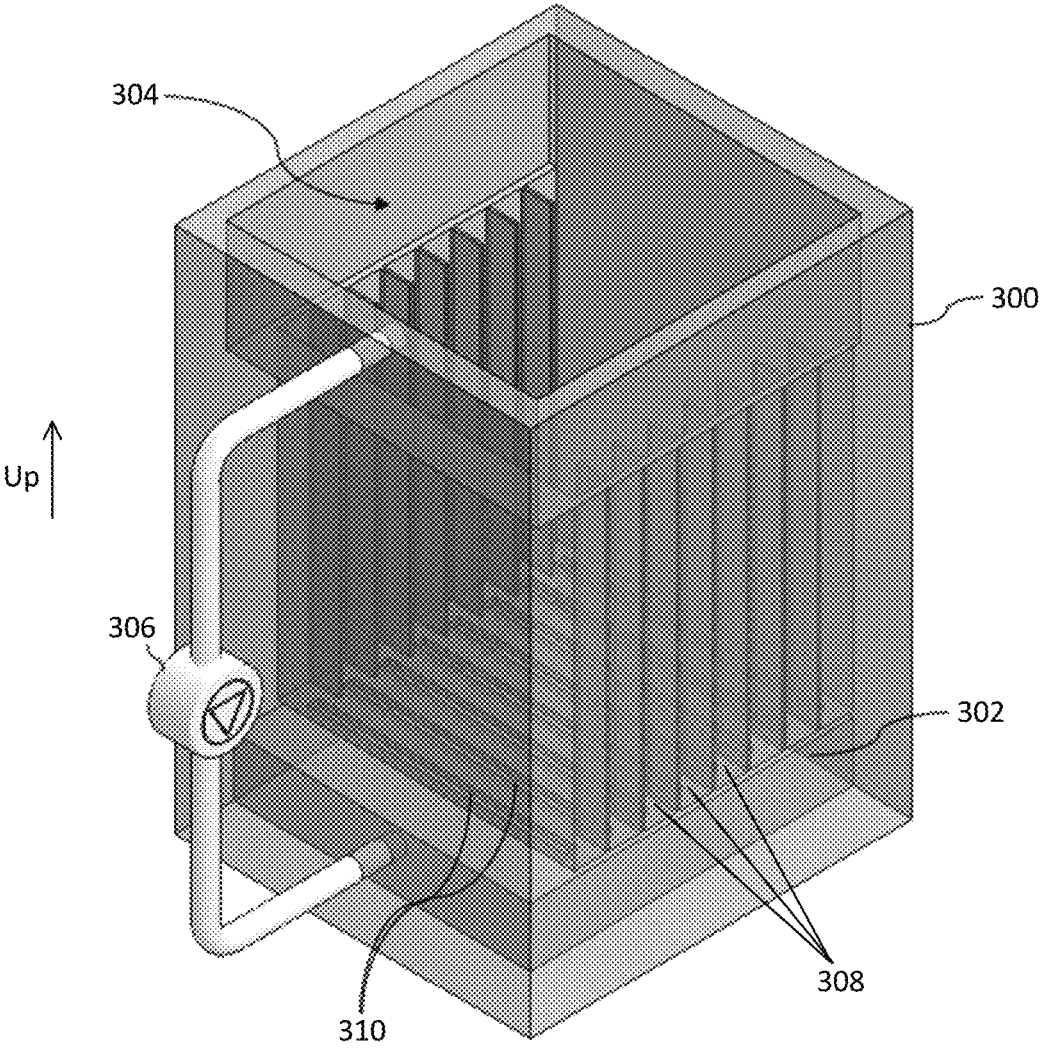
FIG. 3 shows a perspective view of an immersive cooling container containing no casings with electronic devices, in accordance with an implementation of the disclosed technology.
Figure 4:
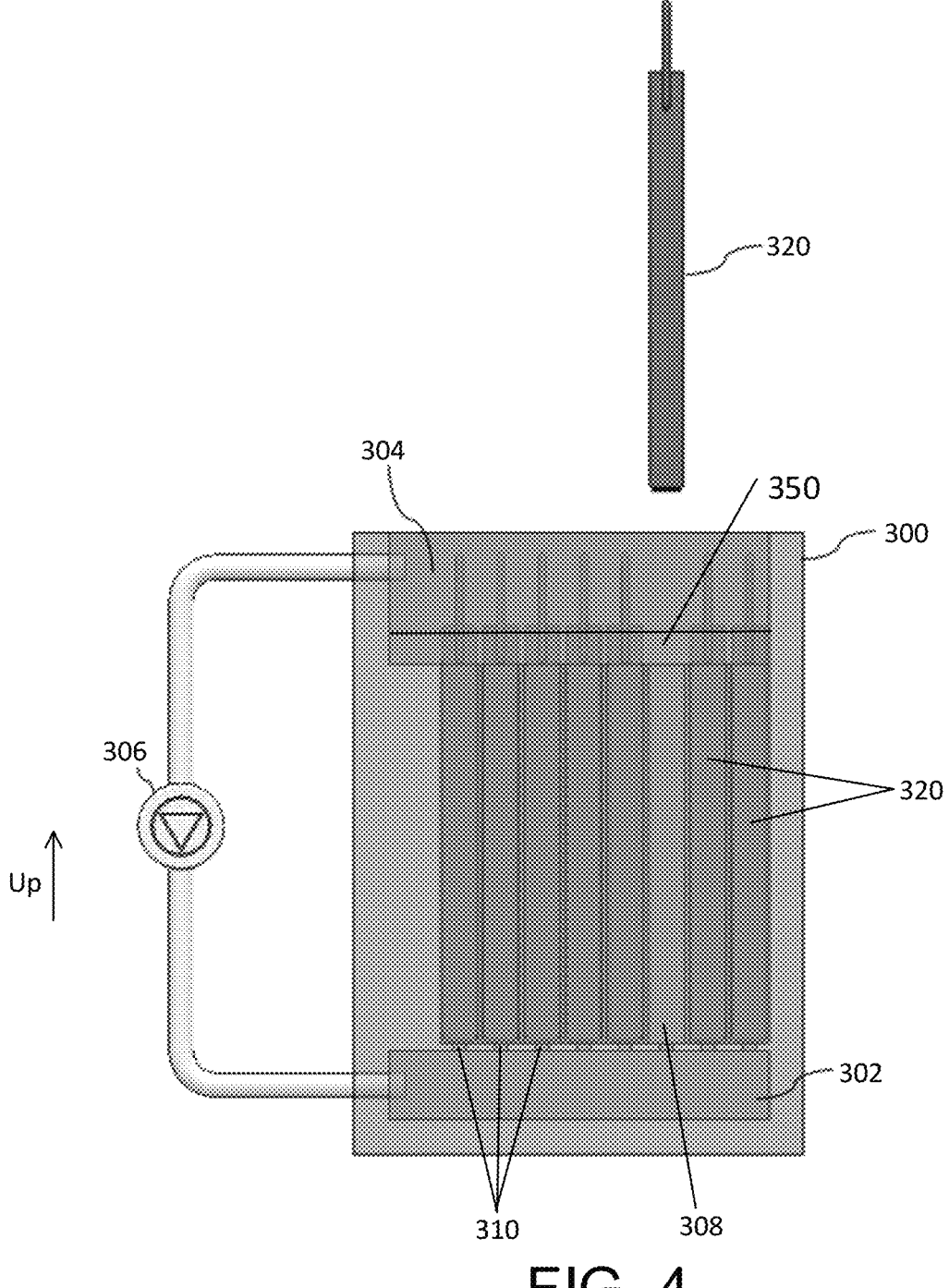
FIG. 4 shows a front elevation view of the immersive cooling container of FIG. 3, containing numerous casings.

FIGS. 3 and 4 show an immersive cooling container 300 according to an implementation of the disclosed technology. FIG. 3 shows a perspective view of the immersive cooling container 300 containing no casings with electronic devices, with the direction of the immersive cooling container indicated by the arrow labeled "up". The immersive cooling container 300 includes a first reservoir 302 and a second reservoir 304. In the implementation shown in FIGS. 3 and 4, a pump 306 is configured to pump heated dielectric immersion cooling liquid from the second reservoir 304 through a heat exchanger (not shown), and to pump the cooled dielectric immersion cooling liquid into the first reservoir 302. The heat exchanger may be, for example, a dry cooler or a liquid-to-liquid heat exchanger.

A set of slots 308 (in FIG. 3, seven such slots 308 a shown) are configured to receive casings (not shown) containing electronic devices to be cooled. A reservoir connector 310 (e.g. a joint) is disposed at a bottom end of each of the slots 308 or on a top surface of the first reservoir 302. The reservoir connectors 310 are configured to be coupled to casing connectors (not shown) on the casings, to permit fluid communication between the first reservoir 302 and an interior of the casings. The reservoir connectors 310 may be selectively and independently open or closed. In the open configuration, a reservoir connected 310 fluidly connects the first reservoir 302 to a corresponding casing. In one embodiment, the reservoirs connectors 310 may detect a presence of a casing in their corresponding slot 308. More specifically, in said embodiment, the reservoirs connectors 310 may be communicably connected to a controller and transmit information about a presence of a casing in their corresponding slot 308. In response to a casing being detected (e.g. a casing connector being coupled to the reservoir connector 310), the controller may open the corresponding reservoir connector 310.

FIG. 4 shows a front elevation view of the immersive cooling container 300, including the first reservoir 302, the second reservoir 304, the pump 306, the slots 308 (only one of which is labeled in FIG. 4, for clarity), and the reservoir connectors 310. As discussed above, the pump 306 circulates dielectric immersion cooling liquid through a heat exchanger.

In FIG. 4, the immersive cooling container 300 contains casings 320 disposed in all but one of the slots 308 (i.e., six such casings have been placed in the immersive cooling container 300), and one illustrative casing 320 outside of the immersive cooling container 300. Each casing 320 houses one or more heat-generating electronic devices (not shown) to be cooled. Each casing 320 includes a casing connector (not shown), such as is shown in FIG. 2. The reservoir connectors 310 are coupled to the casing connectors of the casings in the slots 308, such that the first reservoir 302 is in fluid communication with an interior of each of the casings 320.

In the implementation shown in FIG. 4, a size (i.e. length and width) of the casing connectors is smaller than a size of the corresponding reservoir connectors 310, such that the casing connectors fit within the corresponding reservoir connectors 310. A weight of the casing 320 may be used to assist the fluid connection between the interior of the casing 320 and the first reservoir 302 (e.g., such that no dielectric immersion cooling liquid flows on an exterior side of the casing 10). As shown in FIG. 4, a given immersive cooling container 300 having seven reservoir connectors 310 may provide cooling to heat-generating components disposed in seven or fewer casings 320. Reservoir connectors that are not attached to a casing may be blocked, using metal plates, self-closing mechanisms, or other means of closing or sealing a fluid connection. It will be understood that in some implementations, the size of the casing connectors may be larger than the size of the reservoir connectors, such that the reservoir connectors 310 fit within the corresponding casing connectors.

In use, heat-generating electronic devices are disposed within the casings 320, each casing 320 having a fluid connection to the first reservoir 302 through a reservoir connector 310 and a casing connector (not shown). Cold dielectric immersion cooling liquid flows from the first reservoir 302 into the casings 320 and collects thermal energy from the electronic devices disposed therein. Each casing 320 defines an outlet (not shown) for outputting heated dielectric immersion cooling liquid into the second reservoir 304. The pump 306 then causes a flow of the heated dielectric immersion cooling liquid from the second reservoir 304, to the first reservoir 302. The pump 306 may be fluidly connected to a heat exchanger (e.g. a dry cooler or a liquid-to-liquid heat exchanger) to cool to dielectric immersion cooling liquid before it enters the first reservoir 302.

It should therefore be understood that the casings 320 are, in use, inserted through the second reservoir 304 and in a corresponding slot 308. As such, a plurality of immersive cooling containers 300 may be stacked horizontally in a datacenter.

In a system such as is shown in FIGS. 3 and 4, the fluid flows into the casings 320 through casing connectors in the bottom portions of the casings 320, and out of the casings 320 through outlets in the top portions of the casing 320. Because the heated dielectric immersion cooling liquid will rise as it collects thermal energy from the electronic devices, this corresponds to a natural flow of the dielectric immersion cooling liquid in the casings 320. The cooled dielectric immersion cooling liquid from the first reservoir 302 may rise into the casings 320, for example, due to convection, fluid pressure as heated dielectric immersion cooling liquid rises, and/or use of pumps within the casings 320.

In some embodiments, the second reservoir 304 comprises a sealing chamber 350 on a lower portion thereof. The sealing chamber 350 comprises openings (not shown) aligned with the slots 308. The openings are by default in a closed configuration when no casing 320 is inserted the corresponding slot 308. As such, no dielectric immersion cooling liquid may flow in a given slot 308 if no casing 320 is inserted therein. In other words, when there are no casings 320 in the immersion cooling container 300, no dielectric immersion cooling liquid flow from the first reservoir 302 to the second reservoir 304 through the slots 308. The openings in the sealing chamber 350 enable vertical insertion of the casings 320 through the sealing chamber 350 and within the slots 308. Once the casing 320 is fluidly connected to the first reservoir 302 via a reservoir connector 310 corresponding to the slot 308 where the casing is inserted, the dielectric immersion cooling liquid may flow from the first reservoir 302 to the second reservoir 304 through said casing 320. The immersive cooling container 300 may comprise a sensor for counting a number of casings 320 in the immersive cooling container 300, the sensor being communicably connected to a controller configured to control a rotation speed of the pump 306 based on said number of casings 320. As an example, the rotation speed of the pump 306 is null in response to no casing 320 being detected. The rotation speed of the pump 306 may be increased by a pre-determined value upon an additional connected casing 320 being detected.

Figure 5:
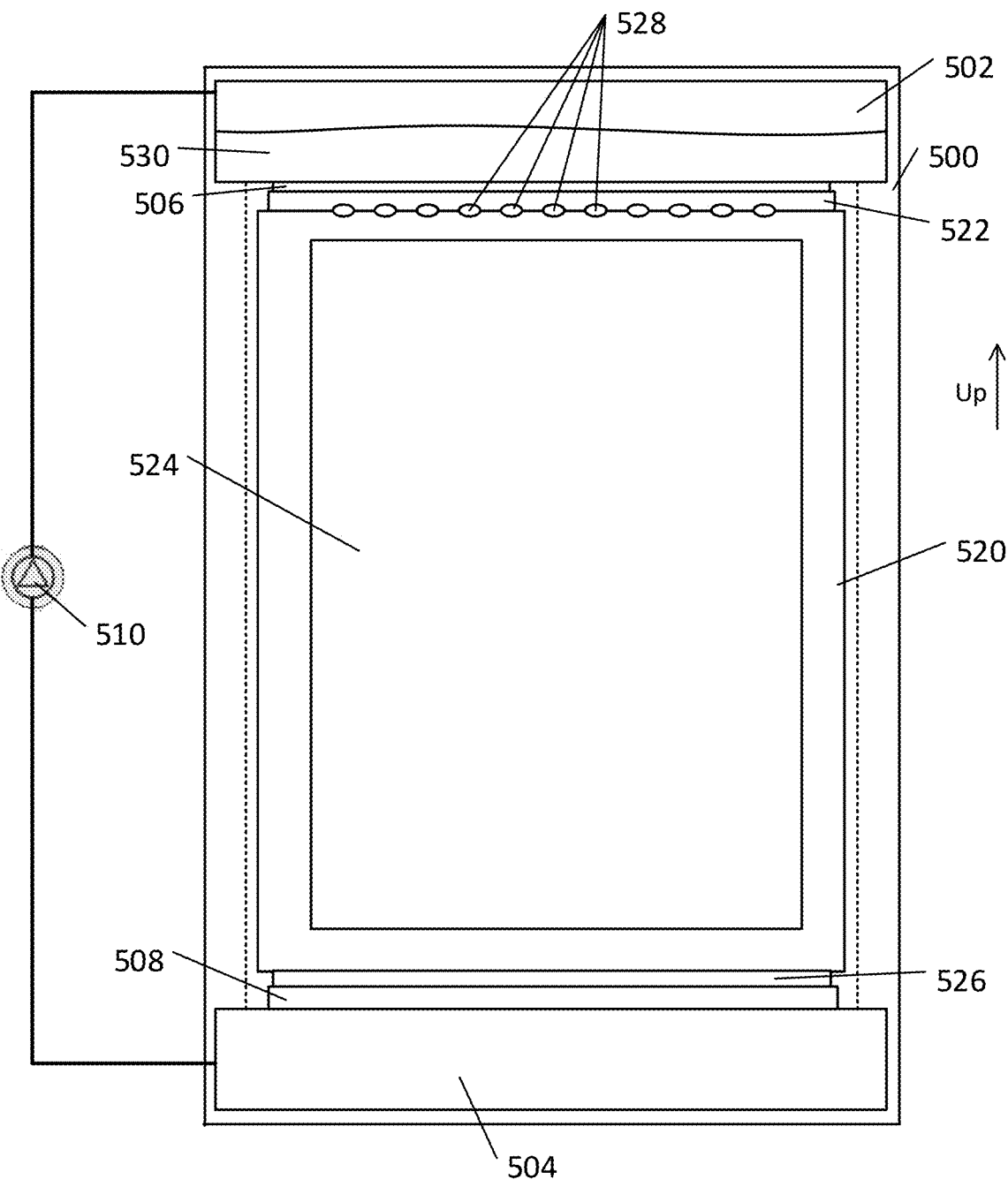
FIG. 5 shows a cut-away schematic view of one a casing inserted into an immersive cooling container, in accordance with another implementation of the disclosed technology.

It is contemplated that the flow of the dielectric fluid may be orentied in an opposite direction in alternative embodiments. Indeed, in another type of immersion cooling system, such as is shown in FIG. 5, the immersion cooling liquid flows over the electronic devices due to gravity. As seen in FIG. 5, which shows a cut-away schematic view of one of the casings 520 inserted into an immersive cooling container 500. The immersive cooling container 500 includes a first reservoir 502 and a second reservoir 504. The first reservoir 502 is disposed above the casing 520, and is fluidly connected to the casing 520 through a first reservoir connector 506, which configured to facilitate the flow of cooled dielectric immersion cooling liquid 530 into an inlet 522 of the casing 520. The inlet 522 may be an open top of the casing 520, or may be a connector that couples with the first reservoir connector 506, as is shown in FIG. 5. It will be understood that although the view shown in FIG. 5 shows only a single casing containing an electronic device, the immersive cooling container 500 includes numerous slots (not shown), and may contain numerous casings.

A heat-generating electronic device 524 is contained within the casing 520, and a bottom portion of the casing 520 includes an outlet 526, which is configured to facilitate the flow of the dielectric immersion cooling liquid out of the casing 520, and into the second reservoir 504. In some implementations, the outlet 526 may be an opening, and the second reservoir 504 may have an open top, permitting the dielectric immersion cooling liquid to flow directly from the outlet 526 into the second reservoir 504. In some implementations, such as shown in FIG. 5, the outlet 526 may be a connector that couples with a second reservoir connector 508 to facilitate the flow of the heated dielectric immersion cooling liquid into the second reservoir 504. A pump 510 is configured to pump heated dielectric immersion cooling liquid from the second reservoir 304 through a heat exchanger (not shown), and to pump the cooled dielectric immersion cooling liquid into the first reservoir 302. The heat exchanger may be, for example, a dry cooler or a liquid-to-liquid heat exchanger.

In use, either the first reservoir connector 506 or (as shown in the implementation of FIG. 5) the inlet 522 includes openings 528, through which the dielectric immersion cooling liquid 530 pours or drips onto the electronic device 524. The dielectric immersion cooling liquid 530 flows over the electronic device 524, and through the outlet 526 into the second reservoir 504. As the dielectric immersion cooling liquid 530 flows over the electronic device 524, it absorbs heat from various heat-generating components of the electronic device 524 and conveys the heat away from those components. Heated dielectric immersion cooling liquid 530 is pumped by the pump 510 from the the second reservoir 504 to the first reservoir 502. In some implementations, the pump 510 may be fluidly connected to a heat exchanger, the operation of which will generally be familiar to those of skill in the art. The heat exchanger cools the immersion cooling liquid 530 before it is pumped into the first reservoir 502.

It will be understood that the first reservoir 502 may provide dielectric immersion cooling liquid to numerous casings 520, and that the second reservoir 504 may collect heated dielectric immersion cooling liquid from numerous casings 520. As in the implementations described above with reference to FIGS. 3 and 4, unused openings or connectors in the first reservoir and/or second reservoir may be covered with metal plates, blocked with a self-closing mechanism, or or blocked or closed by any other means for closing and/or sealing a fluid connection.

Additionally, in some implementations, the openings 528 of the first reservoir connector 506 or the inlet 522 may include nozzles (not shown), which may be adjustable to control the flow of the dielectric immersion cooling liquid 530 from the first reservoir 502. Such nozzles may also be configured to spray or mist the dielectric immersion cooling liquid 530 onto the electronic device rather than pouring or dripping the dielectric immersion cooling liquid 530 onto the electronic device. Pressure to accommodate such spraying of the dielectric immersion cooling liquid 530 onto the electronic device may be arranged, for example, by filling the first reservoir 502 to increase the hydrostatic pressure or by pumping the dielectric immersion cooling liquid 530 through the first reservoir 502 to provide hydraulic pressure.

Figure 6:
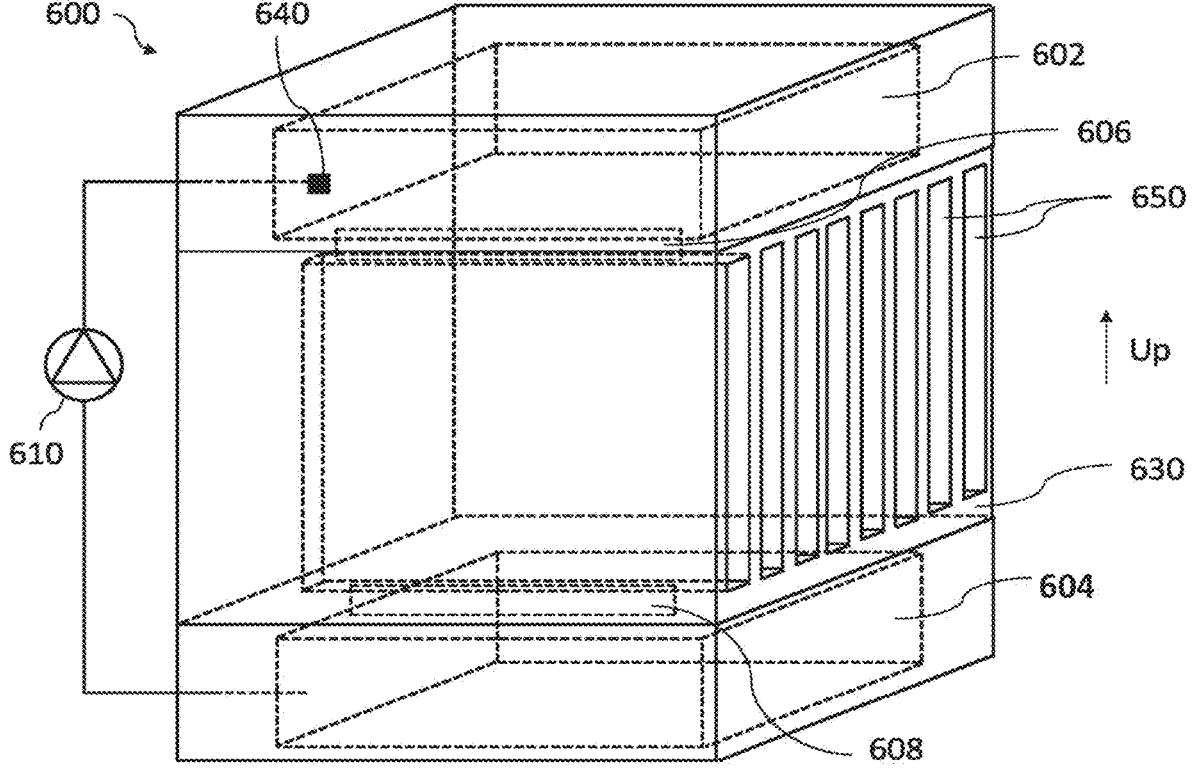
FIG. 6 shows a perspective view of an immersive cooling container in accordance with another implementation of the disclosed technology.
Figure 7:
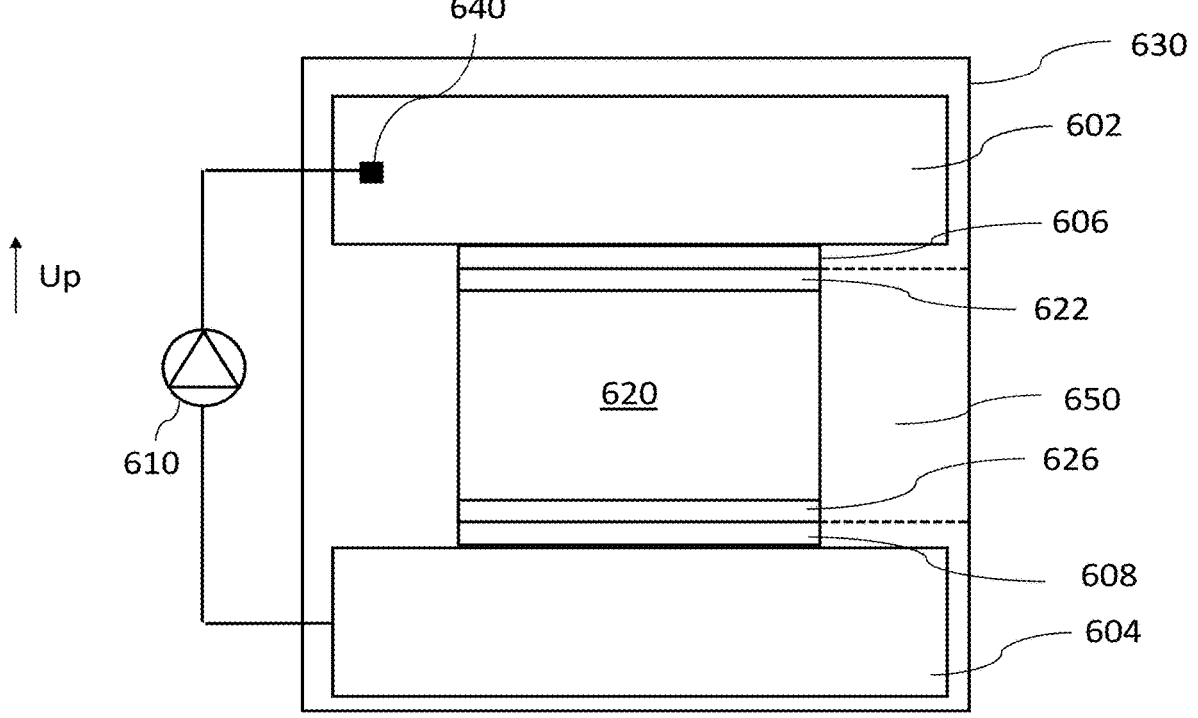
FIG. 7 shows a side elevation view of the immersive cooling container of FIG. 6.

FIGS. 6 and 7 illustrate an inmmersion cooling system in accordance with other embodiments of the present technology. More specifically, there is illustrated an immersive cooling container 600 including a first reservoir 602 and a second reservoir 604. The first reservoir 602 is disposed above lateral slots 650 (only one of which being depicted for clarity). The lateral slots 650 are formed in the immersive cooling container 600 from a lateral surface 630 thereof. In use, each lateral slot 650 may receive a casing 620 (see FIG. 7) including an electronic device to be cooled, each casing 620 being inserted through the lateral surface 630.

It should be thus noted that the first reservoir 602 is sealed on an upper surface of the immersive cooling container 600. Therefore, a plurality of immersive cooling containers 600 may be vertically stacked one on top of another.

As best shown on FIG. 7, each casing 620 comprises an upper casing connector 622 and a lower casing connector 626 configured to couple the casing 620 to corresponding upper and lower reservoir connectors 606, 608 respectively in the immersive cooling container 600. The upper and lower casing connectors 622, 624 may be similar to the casing connector 202 or have similar characteristics. In this embodiment, the upper and lower casing connectors 622, 624 are in a closed configuration by default (e.g. using self-closing mechanisms) such that the casing 620 may be sealed. The upper and lower casing connectors 622, 624 are actuated from the closed configuration to an open configuration in response to the casing 620 being inserted in the lateral slot 650. As an example and without limitation, the upper and lower casing connectors 622, 624 and the upper and lower reservoir connectors 606, 608 may be blind mate connectors.

More specifically, the upper casing connector 622 is defined at an upper surface of the casing 620. The lower casing connector 626 is defined at a lower surface of the casing 620. As such, upon insertion of a casing 620 in a corresponding lateral slot 650, fluid connection between the casing 620 and the first reservoir is enabled by coupling of the upper casing connector 622 and the upper reservoir connector 606. Similarly, fluid connection between the casing 620 and the second reservoir is enabled by coupling of the lower casing connector 626 and the lower reservoir connector 608. For example, the upper and lower casing connectors 622, 624 may be quick-connect technology-based connectors that automatically open upon engaging the upper and lower reservoir connector 606, 608. It should therefore be understood that no dielectric fluid is present in a given slot 650 when no casing 620 is present in said given slot 650. Fluid communications between the casing 620 and the upper and lower reservoirs 602, 604 occurs in response to the casing 620 being inserted in a given slot 650. In other words, the upper casing connector 622 provides an inlet to the casing 620, such that an interior of the casing 620 is in fluid communication with the first reservoir 602. Similarly, the casing 620 also lower casing connector 626 provides an outlet configured to permit the flow of heated dielectric immersion cooling liquid from the casing 620 to the second reservoir 604.

A pump 610 is configured to pump heated dielectric immersion cooling liquid from the second reservoir 604 through a heat exchanger (not shown), and to pump the cooled dielectric immersion cooling liquid into the first reservoir 602. The heat exchanger may be, for example, a dry cooler or a liquid-to-liquid heat exchanger. A nozzle 640 may spay the cooled dielectric immersion cooling liquid in the first reservoir 602. In alternative embodiments, the pump 610 may pump the dielectric immersion cooling fluid from the first reservoir 602 through said heat exchanger and into the second reservoir 604. In other words, a direction of a flow of the dielectric immersion cooling fluid in said alternative embodiments is opposed to the direction of the flow of the dielectric immersion cooling fluid as depicted in FIGS. 6 and 7.

In at least one embodiment, the upper and lower reservoir connectors 606, 608 may be communicably connected with a controller, such as controller 800 (see FIG. 8), that receives information about a presence of a casing 620 in a slot 650 corresponding to said upper and lower reservoir connectors 606, 608. The upper and lower reservoir connectors 310 may be selectively and independently open or closed by said controller. In response to receiving from both of the upper and lower reservoir connectors 606, 608 information indicative of a presence of the casing 620 in the corresponding slot 650, the controller may actuate the upper and lower reservoir connectors 606, 608 to be open and thus let the cooled dielectric immersion cooling liquid flow from the first reservoir 602 to the second reservoir 604 through the casing 620. In parallel to opening the cooled dielectric immersion cooling liquid, the controller may adjust a rotation speed of the pump 610 such that a flow of the dielectric immersion cooling liquid is adapted to a number of casing 620 present in the immersive cooling container 600. For instance, if a new casing 620 is detected in a given slot 605, the controller may cause the rotation speed of the pump 610 to increase.

Moreover, in response to receiving from both of the upper and lower reservoir connectors 606, 608 information indicative of an absence of casing 620 in the corresponding slot 650, the controller may actuate the upper and lower reservoir connectors 606, 608 to be closed. In parallel to closing the upper and lower reservoir connectors 606, 608, the controller may cause the rotation speed of the pump 610 to decrease. As an example, a rotation speed of the pump 610 when no casing 620 is present in the immersive cooling container 600 is null.

Figure 8:
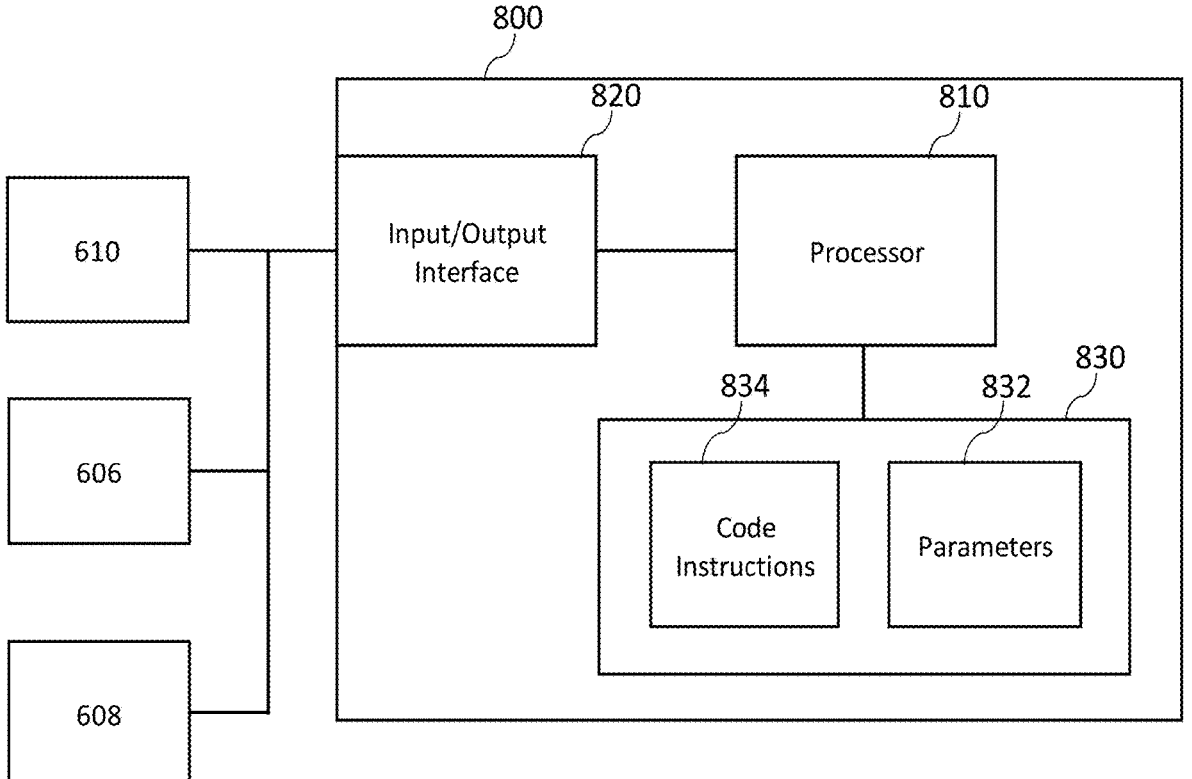
FIG. 8 is a schematic block diagram of a controller in accordance with another implementation of the disclosed technology.

FIG. 8 is a schematic block diagram of a controller 800 of immersive cooling containers disclosed herein according to an embodiment of the present technology. The controller 800 comprises a processor or a plurality of cooperating processors (represented as a processor 810 for simplicity), a memory device or a plurality of memory devices (represented as a memory device 830 for simplicity), and an input/output interface 820 allowing the controller 800 to communicate with components of the immersive cooling containers. The processor 810 is operatively connected to the memory device 830 and to the input/output interface 820. The memory device 830 includes a storage for storing parameters 832, including for example and without limitation pre-determined rotation speeds of a pump of the immersive cooling container according to a number of casings present in the immersive cooling container. The memory device 830 may comprise a non-transitory computer-readable medium for storing code instructions 834 that are executable by the processor 810 to allow the controller 800 to perform the various tasks allocated to the controller 800.

The controller 800, upon being implemented to control operations of the immersive cooling container 600, is operatively connected, via the input/output interface 820, to the pump 610, the upper reservoir connectors 606 and lower reservoir connectors 608. The controller 800 executes the instructions 834 stored in the memory device 830 to implement the various above-described functions that may be present in an embodiment. FIG. 8 as illustrated represents a non-limiting embodiment of the controller 800. This particular embodiment is not meant to limit the present disclosure and is provided for illustration purposes.

It will be understood that, although the embodiments and/or implementations presented herein have been described with reference to specific features and structures, various modifications and combinations may be made without departing from the disclosure. For example, it is contemplated that in some implementations, the features described above may be used in different arrangements, or in other combinations. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. An immersive cooling system configured to cool at least one electronic device, the immersive cooling system comprising:

an immersive cooling container, including:

a first reservoir, configured to contain a dielectric immersion cooling liquid;

a second reservoir, configured to contain the dielectric immersion cooling liquid;

a plurality of slots, each slot in the plurality of slots configured to hold a casing;

a reservoir connector corresponding to each slot in the plurality of slots, the reservoir connector configured to provide fluid communication with the first reservoir; and a pump configured to convey the dielectric immersion cooling liquid from the second reservoir to the first reservoir; and a casing, configured to contain an electronic device to be cooled in an interior portion of the casing and configured to be disposed within a slot in the plurality of slots of the immersive cooling container, the casing including:

an inlet configured to be in fluid communication with the reservoir connector corresponding to the slot within which the casing is disposed to facilitate flow of the dielectric immersion cooling liquid into the interior portion of the casing through the reservoir connector, such that the dielectric immersion cooling liquid contacts the electronic device to collect thermal energy from the electronic device; and an outlet configured to facilitate flow of the dielectric immersion cooling liquid from the interior portion of the casing into the second reservoir, wherein the second reservoir comprises a sealing chamber, the sealing chamber comprising a plurality of openings aligned with the plurality of slots, each opening enabling insertion of a casing in a corresponding one of the slots, each opening being in a closed configuration by default to prevent the dielectric immersion cooling liquid from flowing from the second reservoir to a corresponding slot in absence of a casing in said slot.

2. The immersive cooling system of claim 1, wherein the inlet comprises a casing connector configured to fluidly couple with the reservoir connector corresponding to the slot within which the casing is disposed.

3. The immersive cooling system of claim 2, wherein a size of the casing connector is smaller than a size of the reservoir connector, such that the casing connector fits within the corresponding reservoir connector.

4. The immersive cooling system of claim 2, wherein a size of the casing connector is larger than a size of the reservoir connector, such that the reservoir connector fits within the corresponding casing connector.

5. The immersive cooling system of claim 2, wherein the casing connector is disposed on a bottom portion of the casing.

6. The immersive cooling system of claim 1, wherein the reservoir connector corresponding to an empty slot is closed using a self-closing mechanism.

7. The immersive cooling system of claim 1, wherein the first reservoir is disposed below the casing, such that the dielectric immersion cooling liquid from the first reservoir flows upwards into the interior portion of the casing.

8. The immersive cooling system of claim 7, wherein the outlet is disposed in an upper portion of the casing, and wherein the second reservoir is disposed at an upper portion of the casing, to receive a flow of the dielectric immersion cooling liquid from the outlet.

* * * * *